United States Patent [19]

Barre

[11] Patent Number: 4,513,210

[45] Date of Patent: Apr. 23, 1985

[54] CIRCUIT ARRANGEMENT CONSTRUCTED IN ECL CIRCUITRY

[75] Inventor: Claude Barre, Munich, Fed. Rep. of Germany

[73] Assignee: Siemens Aktiengesellschaft, Berlin & Munich, Fed. Rep. of Germany

[21] Appl. No.: 511,232

[22] Filed: Jul. 6, 1983

[30] Foreign Application Priority Data

Aug. 30, 1982 [DE] Fed. Rep. of Germany ....... 3232199

[51] Int. Cl.³ .................... H03K 19/086; H03K 19/20
[52] U.S. Cl. ...................................... 307/455; 307/467
[58] Field of Search ............... 307/454, 455, 466, 467, 307/443

[56] References Cited

U.S. PATENT DOCUMENTS

| | | | |
|---|---|---|---|
| 3,467,839 | 9/1969 | Miller | 307/455 X |
| 3,509,362 | 4/1970 | Bartholomew | 307/455 |
| 3,522,446 | 8/1970 | Kodama | 307/455 |
| 3,549,899 | 12/1970 | Beelitz | 307/455 |
| 3,573,489 | 4/1971 | Sramek | 307/455 |
| 4,039,867 | 8/1977 | Blumberg et al. | 307/455 |
| 4,359,689 | 11/1982 | Guenthner | 307/455 X |

Primary Examiner—Larry N. Anagnos
Attorney, Agent, or Firm—Hill, Van Santen, Steadman & Simpson

[57] ABSTRACT

In a circuit arrangement constructed in accordance with ECL technology, having an input emitter follower, a differential amplifier and an output emitter follower for the non-inverted output signal, the emitter of the transistor operated as an output emitter follower is connected to the collector of the transistor operated as an input emitter follower. This provides not only an elimination of stray power consumption but, rather, also enables the potential of the output to be increased far above the normal operating level by applying a potential to the input which is positive in comparison to the collector supply potential. Given use of the invention as input stages of programmable logic arrays, the same is of particular advantage in testing such arrays.

2 Claims, 1 Drawing Figure

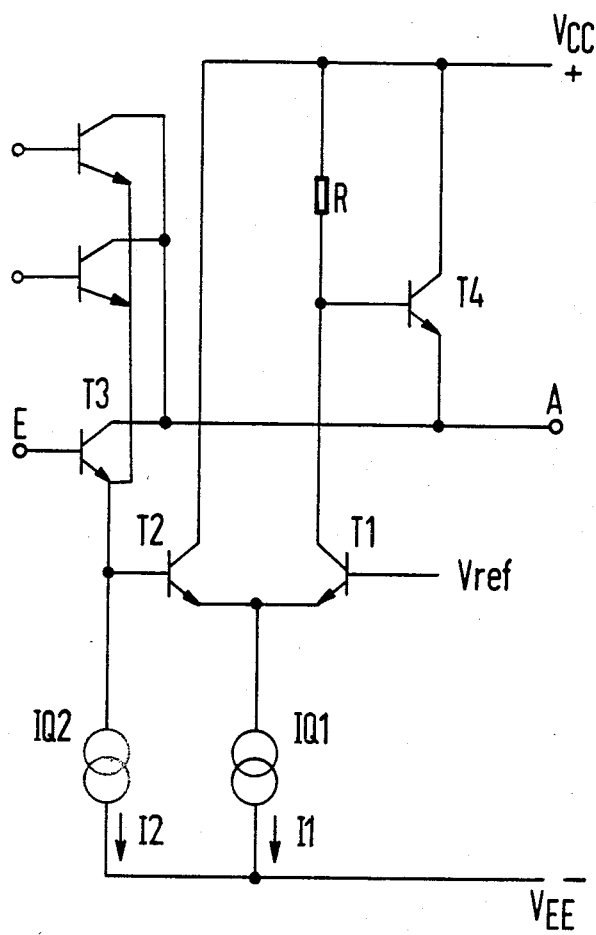

4,513,210

CIRCUIT ARRANGEMENT CONSTRUCTED IN ECL CIRCUITRY

BACKGROUND OF THE INVENTION

1. Field of the Invention

The present invention relates to a circuit arrangement constructed in ECL circuitry comprising an input emitter follower, a differential amplifier having emittercoupled transistors, and an output emitter follower for the non-inverting output signal.

2. Description of the Prior Art

Circuit arrangements constructed in accordance with ECL technology are known in two fundamental executions. Given one embodiment, a differential amplifier having two emitter-coupled transistors directly controlled by the input signal is followed by two emitter followers for providing output signals which are inverted and non-inverted. In the other embodiment, a differential amplifier is preceded by an emitter follower ($E^2CL$). Output emitter followers are generally lacking, yet is advantageous for some purposes to also provide output emitter followers for this embodiment. A corresponding use is provided, for example, given employment in programmable logic arrangements, particularly given an employment as an input stage.

An important goal in the development of integrated circuit arrangements is the reduction of the product of leakage loss and switching time.

SUMMARY OF THE INVENTION

It is therefore the object of the present invention to provide, given the circuit arrangement of the type initially set forth, a reduction in the leakage power without increasing the switching time.

The above object is achieved, according to the present invention, in a circuit arrangement constructed in accordance with ECL technology comprising an input emitter follower, a differential amplifier having emitter-coupled transistors, and an output emitter follower for the non-inverting output signal, in which the emitter of the transistor operated as an output emitter follower is connected to the collector of a transistor operated as an input emitter follower.

BRIEF DESCRIPTION OF THE DRAWING

Other objects, features and advantages of the invention, its organization, construction and operation will be best understood from the following detailed description, taken in conjunction with the accompanying drawing, on which there is a single figure which is a schematic circuit diagram of a circuit arrangement constructed in accordance with the present invention.

DESCRIPTION OF THE PREFERRED EMBODIMENTS

The circuit arrangement illustrated on the drawing comprises a differential amplifier having emitter-coupled transistors T1 and T2. A current source IQ1 supplies a constant current I1 to the differential amplifier. The base of the transistor T1, as usual, is connected to a reference potential $V_{ref}$. The base of the second transistor T2 is connected to the emitter of a transistor T3 which is operated as an emitter follower, the base of the transistor T3 forming an input E for the overall circuit. An at least approximately constant current I2 for feeding the input emitter follower is generated by a current source IQ2 simultaneously operating as a load resistor, the current source IQ2, as known, being frequently replaced by an ohmic resistor.

Given known circuit arrangements of the type under consideration here, the output emitter follower exhibits its own current source. This also applies to embodiments having an open emitter, since a current source or, respectively, a resistor equivalent thereto and connected to the emitter supply potential $V_{EE}$ is only thereby spatially displaced, i.e. is displaced to the side of a following signal receiver.

In contrast thereto, the emitter of a transistor T4, according to the invention, is connected to the collector of the transistor T3 of the input emitter follower for the formation of the output emitter follower having an output A. The current source IQ2 of the input emitter follower then simultaneously forms the current source for the output emitter follower.

The invention is only employable for an output emitter follower which, corresponding to the circuit illustrated on the drawing, is connected to the non-inverting output of the differential amplifier. A collector load resistor R is therefore provided only for the transistor T1. An output emitter follower for inverted output signals would have to receive its own current source in a manner known per se.

In order to form an OR operation of a plurality of input signals, the collector-emitter paths of further transistors can be connected in parallel to the collector-emitter path of the transistor T3 of the input emitter follower. A capacitive load of the output A, however, arises due to the collector capacitances of the additional transistors. The current I2 supplied by the current source IQ2 would have to be increased for compensation so that the advantage achieved by the invention would be at least partially cancelled. It is therefore recommended not to connect more than two to three transistors in parallel in the input of the emitter follower stage.

The possibility exists, given use of the circuit arrangements according to the present invention as input stages of programmable logic arrangements, that the voltage of the output A can be increased far beyond the normal operating values by applying a voltage to the input E which is positive in comparison to the collector supply voltage $V_{CC}$. This enables testing of unprogrammed programmable logic arrangements.

Although I have described my invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A circuit arrangement comprising:
   first and second transistors each including a base, an emitter and a collector;
   said emitters connected together;
   said base of said first transistor connected to a reference potential;
   means connecting said collectors to a first supply potential;
   a first constant current source connected to said emitters and to a second supply potential;

an input emitter follower comprising a third transistor including a base for receiving an input signal, a collector and an emitter connected to said base of said second transistor;

a second constant current source connected to said emitter of said third transistor and to a second supply potential; and an output emitter follower comprising a fourth transistor including a base connected to said collector of said first transistor, a collector connected to the first supply potential and an emitter connected to said collector of said third transistor, whereby said second constant current source supplies both of said input and output emitter followers.

2. The circuit arrangement of claim 1, and further comprising:

an OR input including a plurality of said third transistors each including a base for receiving a respective input signal and a collector-emitter path connected in parallel with like paths of said plurality of third transistors.

* * * * *